United States Patent [19]
Ishida

[11] Patent Number: 5,136,292
[45] Date of Patent: Aug. 4, 1992

[54] SERIAL DATA RECEIVING CIRCUIT FOR SERIAL TO PARALLEL CONVERSION

[75] Inventor: Hisaki Ishida, Tokyo, Japan

[73] Assignee: Oki Electric Industry Co., Ltd., Tokyo, Japan

[21] Appl. No.: 601,799

[22] PCT Filed: Mar. 14, 1990

[86] PCT No.: PCT/JP90/00331

§ 371 Date: Nov. 15, 1990

§ 102(e) Date: Nov. 15, 1990

[87] PCT Pub. No.: WO90/10903

PCT Pub. Date: Sep. 20, 1990

[30] Foreign Application Priority Data

Mar. 15, 1989 [JP] Japan ............... 1-62561

[51] Int. Cl.$^5$ ............................................. H03M 9/00
[52] U.S. Cl. ........................................ 341/100; 377/69
[58] Field of Search .................... 341/100, 101, 95, 93; 377/69, 75, 77

[56] References Cited

U.S. PATENT DOCUMENTS

5,016,011 5/1991 Hartley et al. .................. 341/95

Primary Examiner—A. D. Pellinen
Assistant Examiner—B. K. Young
Attorney, Agent, or Firm—Edward D. Manzo

[57] ABSTRACT

A serial data receiving circuit comprising a most significant bit input detecting circuit (20) for providing a given control signal in synchronism with input of the most significant bit of a serial data represented by twos complement and a data converter circuit (30B) for subjecting the serial data to a sign extension data when the control signal is active and providing the resultant sign extended data as a parallel data and shifting the serial data from a low order bit to a high order bit when the control signal is inactive and providing the shifted data as a parallel data. The serial data receiving circuit further comprising a sign extension data processing circuit (40) for converting the serial data to the sign extension data on the basis of a format designating control signal so that the parallel data represented by sign extended twos complement is obtained upon reception of the serial input data in the twos complement representation having variable numbers of bits or the serial input data of the offset binary, straight binary, twos complement representation.

6 Claims, 7 Drawing Sheets

SERIAL DATA RECEIVING CIRCUIT FOR SERIAL TO PARALLEL CONVERSION

TECHNICAL FIELD

The present invention relates to a serial data receiving circuit for data processing apparatus such as a digital signal processor (hereinafter referred to as DSP), a microcomputer or the like.

BACKGROUND TECHNOLOGY

Prior art in this field is disclosed in "OKI SEMICONDUCTOR INTEGRATED CIRCUIT DATA BOOK '88" (published on November of 1987) or "STANDARD LOGIC IC" p. 859.

An arrangement of the prior art will be described hereafter.

Figure 2:
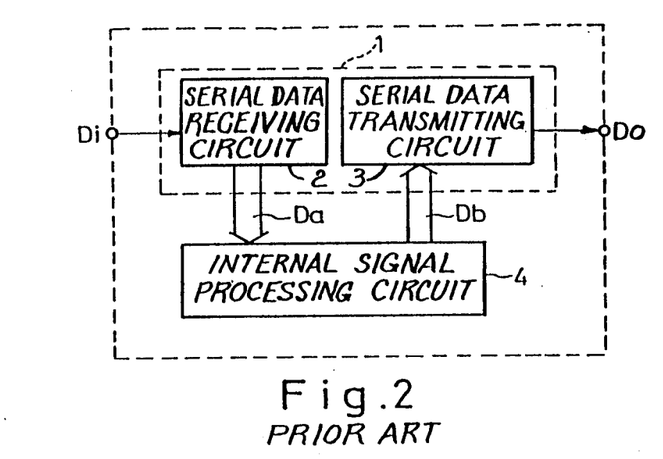
FIG. 2 is a view showing an arrangement of a prior art data processing unit.

FIG. 2 is a block diagram showing an arrangement of a prior art data processing apparatus for the DSP, the microcomputer or the like.

The data processing apparatus 5 comprises a serial interface circuit 1 for transmitting a signal to and receiving the signal from an external device and an internal signal processing circuit 4 in which the serial interface circuit 1 is composed of a serial data receiving circuit 2 and a serial data transmitting circuit 3. According to this data processing apparatus, when serial data Di are input to the serial data receiving circuit 2 the serial data Di are converted to parallel data Da by the serial data receiving circuit 2 and supplied to the internal signal processing circuit 4. The parallel data Da are subjected to a given processing in the internal signal processing circuit 4 and supplied to the serial data transmitting circuit 3 as a parallel data Db. Upon reception of the parallel data Db, the serial data transmitting circuit 3 converts the parallel data Db to serial data Do which are supplied to the external device.

Figure 3:
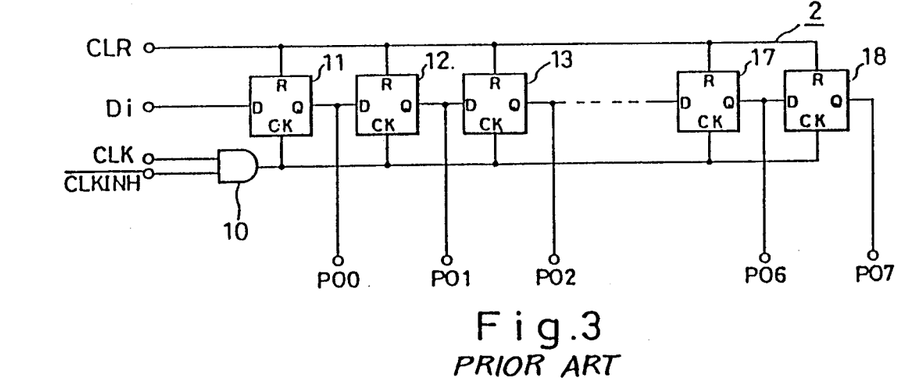
FIG. 3 is a view showing an arrangement of the serial data receiving circuit shown in FIG. 2.

FIG. 3 is a block diagram showing an arrangement of the serial data receiving circuit 2 in FIG. 2.

The serial data receiving circuit 2 comprises, for example, a shift register, for providing eight bits parallel outputs, which is composed of a 2 input AND gate 10 and D-type flip-flops (hereinafter referred to as D-FF) 11 to 18. The D-FFs 11 to 18 each has a reset terminal R for receiving a clear signal CLR, a clock terminal CK for receiving a clock signal CLK and an output terminal Q. Each is connected to one another in that each output terminal Q is connected in series to parallel data output terminals PO0 to PO7. The clock signal CLK and a clock inhibit signal $\overline{CLKINH}$ are respectively connected to inputs of the AND gate 10. An output of the AND gate 10 is connected to each clock terminal CK of the D-FFs 11 to 18.

Figure 4:
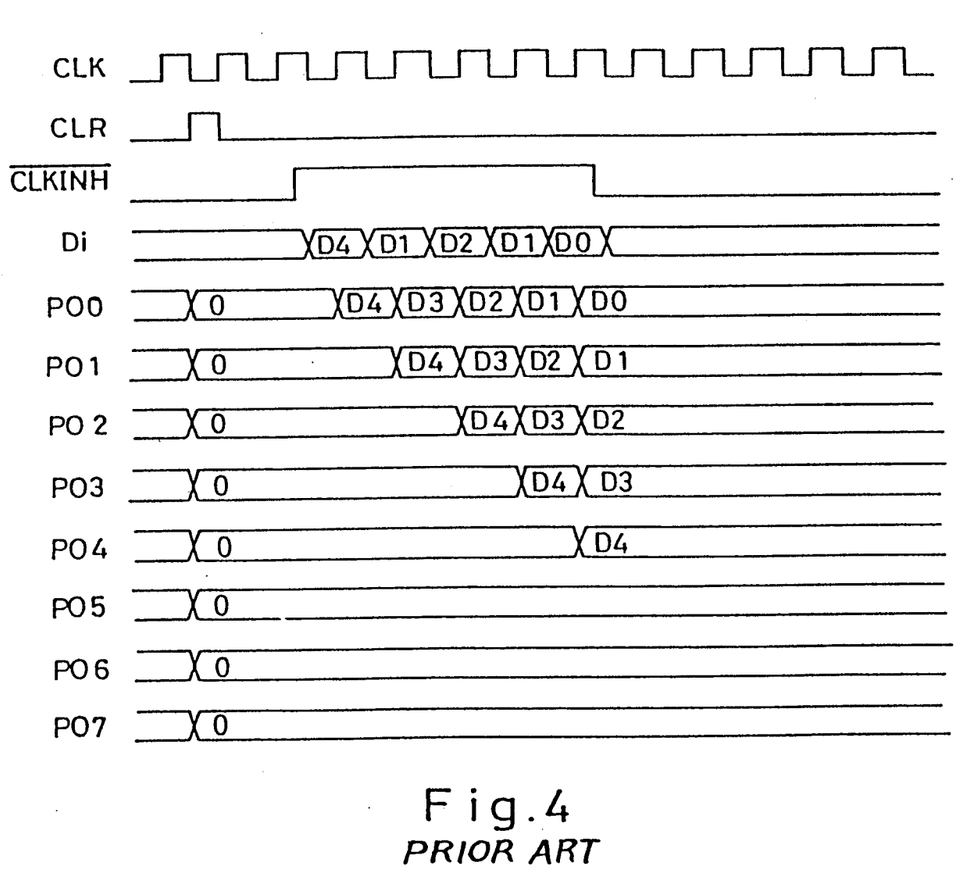
FIG. 4 is a timing chart of the circuit in FIG. 3.

FIG. 4 is a timing chart for when the serial data receiving circuit 2 in FIG. 3 receives five bits of data.

In the serial data receiving circuit 2, the input serial data Di (=D0, D1, ..., D4) are successively transferred to the D-FFs 11 to 18 under the control of the clock signal CLK. The parallel data Da (=D0, D1, ..., D4) are provided from the output terminals PO0 to P07 which are connected to each output terminal Q of the D-FFs 11 to 18.

That is, when the clear signal CLR is allowed to be a logical "1" and the D-FFs 11 to 18 are reset, a logical "0" is provided from the output terminals PO0 to P)7. When the clear signal CLR is allowed to be a logical "0" and the clock inhibit signal $\overline{CLKINH}$ is allowed to be the logical "1", the input signal data D4 to D0 are successively transferred to the D-FFs 11 to 18 at the leading edge of the clock signal CLK by way of the AND gate 10. Upon completion of the input of the signal data D4 of the 5th bit, the clock inhibit signal $\overline{CLKINH}$ is allowed to be the logical "0" so that the input of the five bits of data D4 to D0 is completed. At this time, the parallel data Da, composed of "000D4 D3 D2 D1 D0", are provided from the output terminals PO7 to PO0.

However, the serial data receiving circuit having the arrangement set forth above has the following problems.

(a) When the prior art serial data receiving circuit 2 is provided in the data processing apparatus such as the DSP or the microcomputer or the like, as illustrated in FIG. 2, the parallel data Da, provided by the serial data receiving circuit 2, are processed by the internal signal processing circuit 4. In the DSP or the like, there are many data formats adopting twos complement representation.

However, in case of the serial input and the parallel output both in twos complement representation in the prior art serial data receiving circuit 2, a sign extension is needed when the number of the bits to be applied is less than the number of the bits to be output in parallel.

For example, in the operation of the embodiment as illustrated in FIG. 4, it is necessary to let the outputs of "000D4 D3 D2 D1 D0" of the output terminals PO7 to PO0 to be "D4 D4 D4 D4 D3 D2 D1 D0". That is, most significant bits (hereinafter referred to as MSB) D4 of the five bits input data D4 to D0 is bitpad to a high order bits (PO7 to PO5)(sign extension) by way of the shifting function and the like in the internal signal processing circuit 4. When the numbers of input bits are different, the numbers of input bits are decided by the internal signal processing circuit 4 so that the bit shift and the like are needed to be changed by the control of programs and the like. Furthermore, the sign extension is processed in a different manner from the reception of the serial data which entails in generating time loss.

(b) In case of an offset binary serial output to be used as an analog/digital converter (hereinafter referred to as A/D converter) or parallel output in twos complement representation, there arises the same problem as set forth in above (a) excepting that the parallel data is represented as "D4 $\overline{D4}$ $\overline{D4}$ $\overline{D4}$ D3 D2 D1 D0" (where $\overline{D4}$ is an inverted D4). In case of a straight binary serial input and the parallel output in twos complement representation, the parallel data is kept as "000D4 D3 D2 D1 D0".

The data format of the twos complement representation, the offset binary and the straight binary are, for example, disclosed in literatures such as "PRODUCT DATA BOOK 1987", pp. 5-10, 11 published on Oct. 1, 1987 by Japan BAR BROWN INC.

The present invention is to provide a serial data receiving circuit capable of solving such the problem in the prior art that it was difficult to obtain the parallel output in sign extended twos complement representation or the parallel output converted into the data in twos complement representation upon reception of the serial input data in the twos complement representation having variable numbers of bits or the serial input data of the offset binary, straight binary, twos complement representation.

DISCLOSURE OF THE INVENTION

Figure 1A:
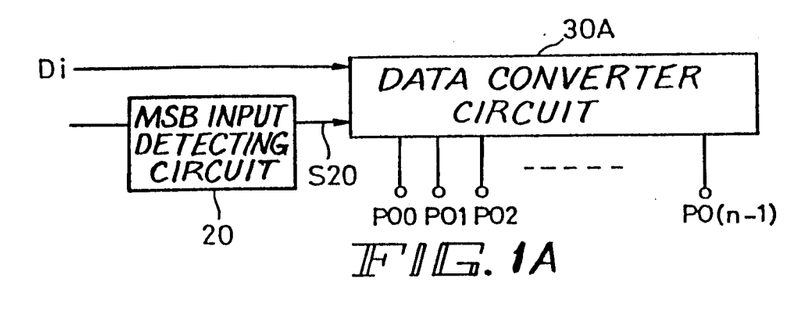
FIGS. 1A and 1B are views each showing an arrangement of a serial data receiving circuit according to first and second inventions embodiment of the present invention.
Figure 1B:
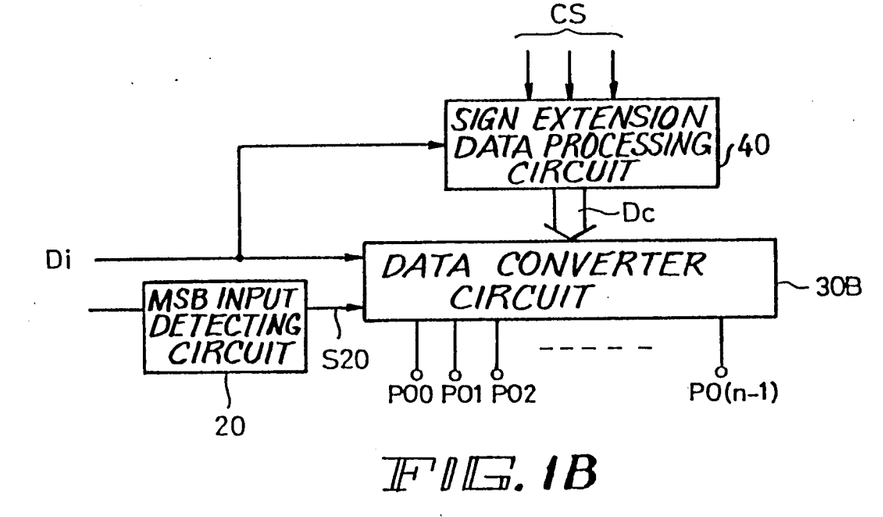

FIGS. 1A and 1B are views showing arrangements of a serial data receiving circuit according to first and second embodiments of the present invention which will be described hereafter with reference to these figures.

The serial data receiving circuit is, for example, provided in a data processing circuit as illustrated in FIG. 2 in which a first serial data receiving circuit has, as illustrated in FIG. 1A, a MSB input detecting circuit 20 for detecting a most significant bit (hereinafter referred to as MSB) of serial data Di in twos complement representation to thereby provide a corresponding control signal S20 which is connected to a data converter circuit 30A. The data converter circuit 30A effects sign extension for the serial data Di at the time when the control signal S20 is active and provides the resultant sign extended serial data from the output terminal PO0 to PO(n−1) as the parallel data while it shifts the serial data Di from the low order bit to the high order bits when the control signal S20 is inactive and provides the n-bits parallel data from the output terminal PO0 to PO(n−1).

As mentioned above, since there is provided the MSB input detecting circuit and the data converter circuit according to the first embodiment of the present and, it is possible to obtain the parallel data in sign extended twos complement representation with simplicity and assurance without losing time upon reception of the serial data in twos complement representation which is variable in the number of input bits. Furthermore, the arrangement of the first embodiment of the present invention can interface with a plurality of serial data transmitting circuits having different numbers of bits in the same circuit.

The serial data receiving circuit according to the second embodiment of the present invention comprises, as illustrated in FIG. 1B, a MSB input detecting circuit 20 for detecting the MSB of the serial data Di and providing the corresponding control signal S20, a sign extension data processing circuit 40 for coverting the serial data Di to sign extension data Dc upon reception of format designating control signals CS, and a data converter circuit 30B connected to the output of the MSB input detecting circuit 20 and the output of the sign extension data processing circuit 40. The data converter circuit 30B provides the sign extension data as the n bit parallel data from the output terminals PO0 to PO(n−1) when the contorol signal S20 is active and provides the serial data Dc as the n bit parallel data from the output terminals PO0 to PO(n−1) by shifting the serial data Dc from low order bit to the high order bit when the control signal S20 is inactive.

According to the second embodiment of the present invention, inasmuch as there are provided the MSB input detecting circuit, the sign extension data processing circuit and the data converter circuit, it is possible to obtain the parallel data converted to the data in twos complement representation with ease and assurance and without loss of time upon reception of the serial input on the twos complement representation having variable numbers of the input bits or the serial input of the offset binary, straight binary, twos complement representation. Furthermore, it is possible to effect an interface between a plurality of serial data transmitting circuits having different numbers of bits in the same circuit or a plurality of serial data transmitting circuits having different data format.

BEST MODE FOR CARRYING OUT THE INVENTION

The present invention will be described more in detail with reference to the attached drawings.

Figure 5:
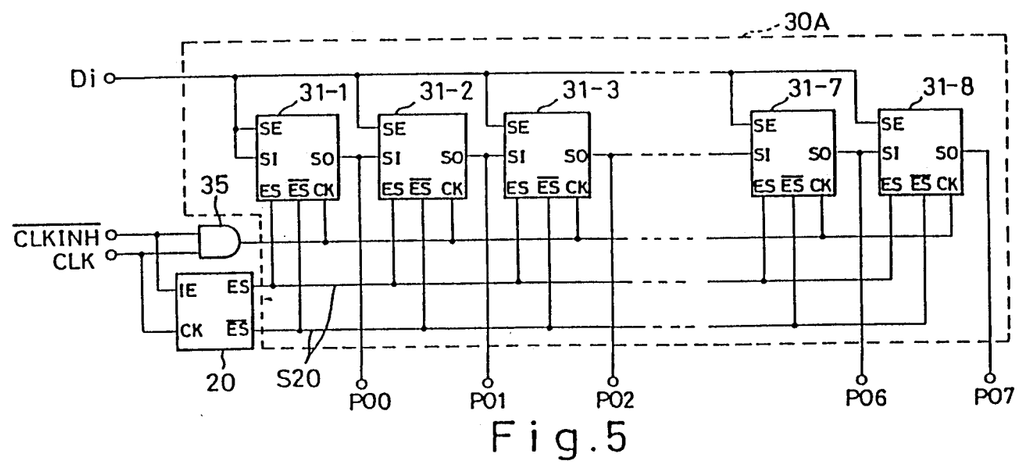
FIG. 5 is a view showing an arrangement of the serial data receiving circuit according to an embodiment of the present invention as illustrated in FIG. 1A.

FIG. 5 is a view showing a first arrangement of a serial data receiving circuit according to an embodiment of the present invention as illustrated in FIG. 1A.

Figure 6:
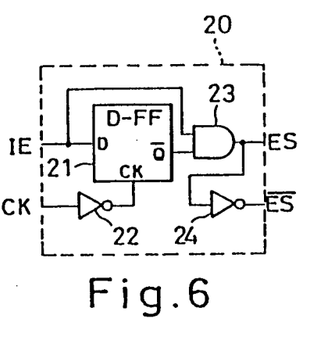
FIG. 6 is a circuit diagram of an MSB input detecting circuit shown in FIG. 5.

The serial data receiving circuit is a circuit for eight bits serial input and parallel output data in which the input detecting circuit 20 has an input terminal IE for an input enable signal, a clock terminal CK, and control terminals ES, $\overline{ES}$ for the control signal S20. The terminal IE is connected to a clock inhibit signal $\overline{CLKINH}$ and the clock terminal CK is connected to a clock signal CLK. The clock inhibit signal $\overline{CLKINH}$ and the clock signal CLK are, respectively, connected to a data converter circuit 30A by way of 2 input AND gate 35. The data converter circuit 30A comprises eight unit circuits 31-1 to 31-8, respectively connected in series. Each of the unit circuits 31-1 to 31-8 has input terminals SE, SI, control terminals ES, $\overline{ES}$, a clock terminal CK and an output terminal SO wherein the input terminal SE of each of the unit circuits 31-1 to 31-8 is connected to an input serial data Di, the input terminal SI of the unit circuit 31-1 is connected to the input serial data Di and each of the unit circuits 31-2 to 31-8 is connected to the output terminals SOs of the front stage unit circuits 31-1 to 31-7. The clock terminal CK of each of the unit circuits 31-1 to 31-8 is connected to an output of AND gate 35, the control terminals ES, $\overline{ES}$ are connected to control terminals ES, $\overline{ES}$ of the MSB input detecting circuit 20 and the output terminals SOs are connected to output terminals PO0 to PO7. FIG. 6 is a circuit diagram of an arrangement of the MSB input detecting circuit 20 shown in FIG. 5.

The MSB input detecting 20 has a D-FF 21 having an input terminal D, a clock terminal CK and an output terminal Q wherein the input terminal D of the D-FF 21 is connected to an input terminal IE of the input enable signal and the clock terminal CK is connected to the clock terminal CK of the clock terminal of the MSB input detecting circuit 20 by way of an inverter 22 for inverting the signal. The input terminal IE and the output terminal $\overline{Q}$ of the D-FF 21 are, respectively, connected to an input of a 2 input AND gate 23. An output of the AND gate 23 is connected to a control terminal ES for receiving an extension select signal and to the control terminal $\overline{ES}$ by way of the inverter 24 for inverting the signal. The MSB input detecting circuit 20 provides a diferrential signal relative to the input terminal IE to the control terminal ES when terminal ES becomes active when the MSB input detecting circuit 20 is ON whereby the sign extension timing can be detected.

Figure 7:
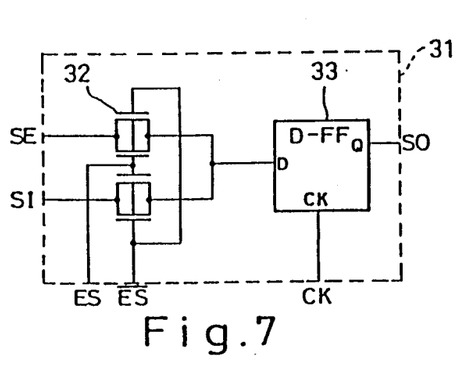
FIG. 7 is a circuit diagram of a unit circuit shown in FIG. 5.

FIG. 7 is a circuit diagram showing an arrangement of the unit circuit 31 (=31-1 to 31-8).

The unit circuit 31 has a selector 32, an input terminal D, a clock terminal CK and a D-FF 33 providing an output terminal Q. When the control terminal ES of the expand select signal is active in the case that the MSB input detecter circuit is ON so that the control terminal ES selects the sign extension data control terminal SE to thereby set the D-FF 33 and allow the control terminal ES inactive when the MSB input detecting circuit is OFF whereby the control terminal ES selects the input control terminal SI from the front stage D-FF 33 and set the D-FF 33.

Figure 8:
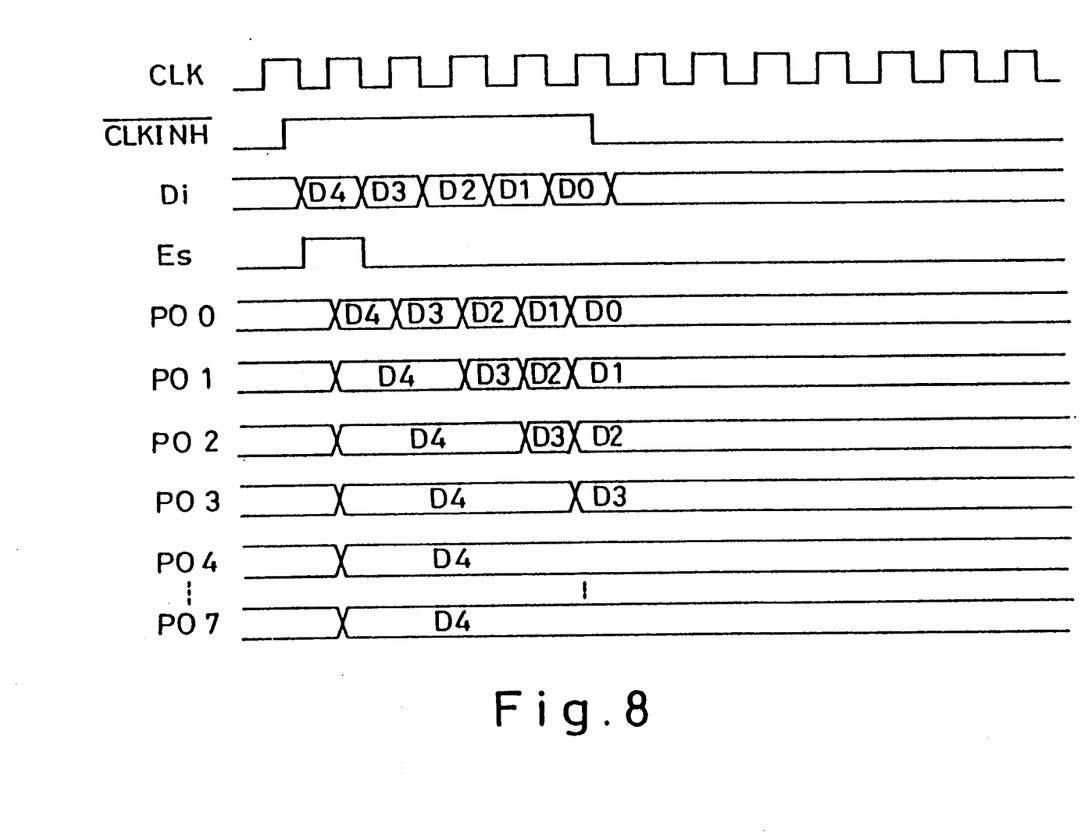
FIG. 8 is a timing chart of the circuit in FIG. 5.

FIG. 8 is a timing chart of assistance in explaining the five bits serial data DI (=D4 to D0) being input.

An opperation of the arrangement as illustrated in FIG. 5 will be described hereinafter.

When the clock inhibit signal $\overline{CLKINH}$ is allowed to be "1", the AND gate 35 is open so that the serial data DI (=D4 to D0) are successively transferred to the unit circuit 31-1 to 31-8 at the leading edge of the clock signal CLK, and the clock inhibit signal $\overline{CLKINH}$ is allowed to be "0" at the completion of the input of the serial data D4 in 5th bit whereby the serial data D4 of the 5th bit is completed.

When the serial data D4 of the MSB is input, the control terminal ES of the MSB input detecting circuit 20 becomes active and the control terminal SE is selected by the selector 32 for each of the unit circuits 31-1 to 31-8 so that the selected control terminal SE is connected to the input terminal D of the selected D-FF 33. The serial data D4 of the MSB is subjected to a sign extension and bitpad in the D-FF 33 at the leading edge of the clock signal CLK and the serial data 4 is output from the output terminal PO7 to PO0. For example, when the input serial data D4 to D0 are positive numbers "0101", D4 "0" is subjected to the sign extension so that the output terminals PO7 to PO0 become "00000101" upon completion of the input of the serial data. When the input serial data D4 to D0 are negative numbers "1010", the D4 "1" is subjected to the sign extension so that the output terminals PO7 to PO0 become "11111010" upon completion of the input of the serial data.

The following effects can be obtained according to the present embodiment:

(i) In the n-bit serial data receiving circuit, the n-bit parallel data Da in twos complement representation are obtained upon reception of the 1—n bit arbitrary length's serial data Di in two complement representation without loss of time; and (ii) As illustrated in FIG. 2, it is possible to effect interface between a plurality of serial data transmitting circuits 3 having different numbers of bits in the same circuit.

Figure 9:
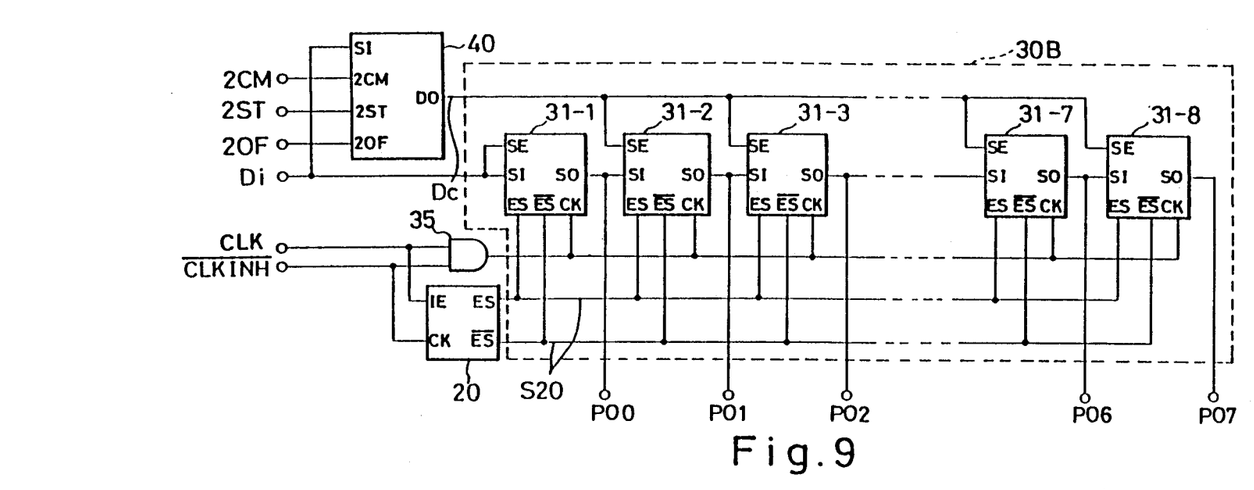
FIG. 9 is a view showing an arrangement of the serial data receiving circuit according to an embodiment of the present invention shown in FIG. 1B.

FIG. 9 is a view showing an arrangement of the serial data transmitting circuit accoridng to a second embodiment of the present invention as illustrated in FIG. 1B in which elements which are the same as those illustrated in FIGS. 5 to 7 are designated with the same numerals.

The serial data transmitting circuit is a circuit for eight bits serial input and parallel output and is provided with the data converter circuit 30B having same arrangement of the data converter circuit 30A as illustrated in FIG. 5 in which the control terminal SE of each of the unit circuits 31-1 to 31-8 is connected to the output terminal DQ of the sign extension data Dc of the sign extension data processing circuit 40. The sign extension data processing circuit 40 has input terminals 2CM, 2ST, 20F for the format designating control signal CS in addition to the input terminal SI for receiving the serial data Di in which the input terminal 2CM is connected to the twos complement data 2CM, the input terminal 2ST is connected to the straight binary data 2ST and the input terminal 20F is connected to the offset binary data 20F.

Figure 10:
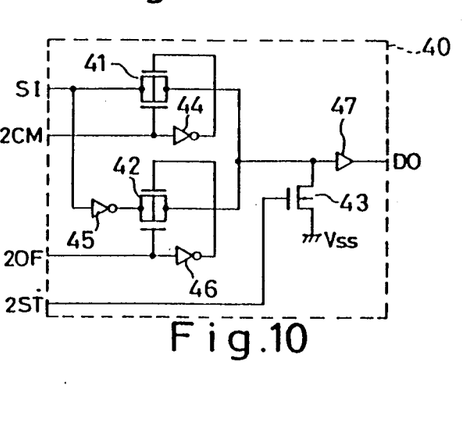
FIG. 10 is a circuit diagram of a signal extension data processing circuit of shown in FIG. 9.

FIG. 10 is a circuit diagram showing an arrangement of the sign extension data processing circuit 40 shown in FIG. 9.

The sign extension processing circuit 40 comprises switches 41, 42, 43, inverters 44, 45, 46 and a buffer 47. The switch 41 turns on or off a signal from the input terminal SI upon reception of a signal from the input terminal 2CM and an inverted signal thereof the switch 42 turns on or off an inverted signal from the input terminal SI upon reception of a signal from the input terminal 20F and the inverted signal thereof. The switch 43 controls the on or off between the output of the switches 41 and 42 and the ground potential $V_{SS}$.

The sign extension data processing circuit 40 is a basis of any of the input serial data Di in twos complement representation, the offset binary data, the straight binary data. The same sign extension data processing circuit 40 has the following functions:

1. In case of the input of the twos complement data, only the input terminal 2CM is allowed to be "1" and the other input terminals 2ST, 20F are allowed to be "0" so that the input serial data Di is output to the output terminal DO;

2. In case of the input of the offset binary data, only the input terminal 20F is allowed to be "1" and the other input terminals 2MC, 2ST are allowed to be "0" so that the inverted signal of the input serial data Di from the input terminal SI is output to the output terminal DO and.

3. In case of the input of the straight binary date, only the input terminal 2ST is allowed to be "1" and the other input terminals 2CM, 2SI are allowed to be "0" so that the "0" data is output to the output terminal DO.

Figure 11:
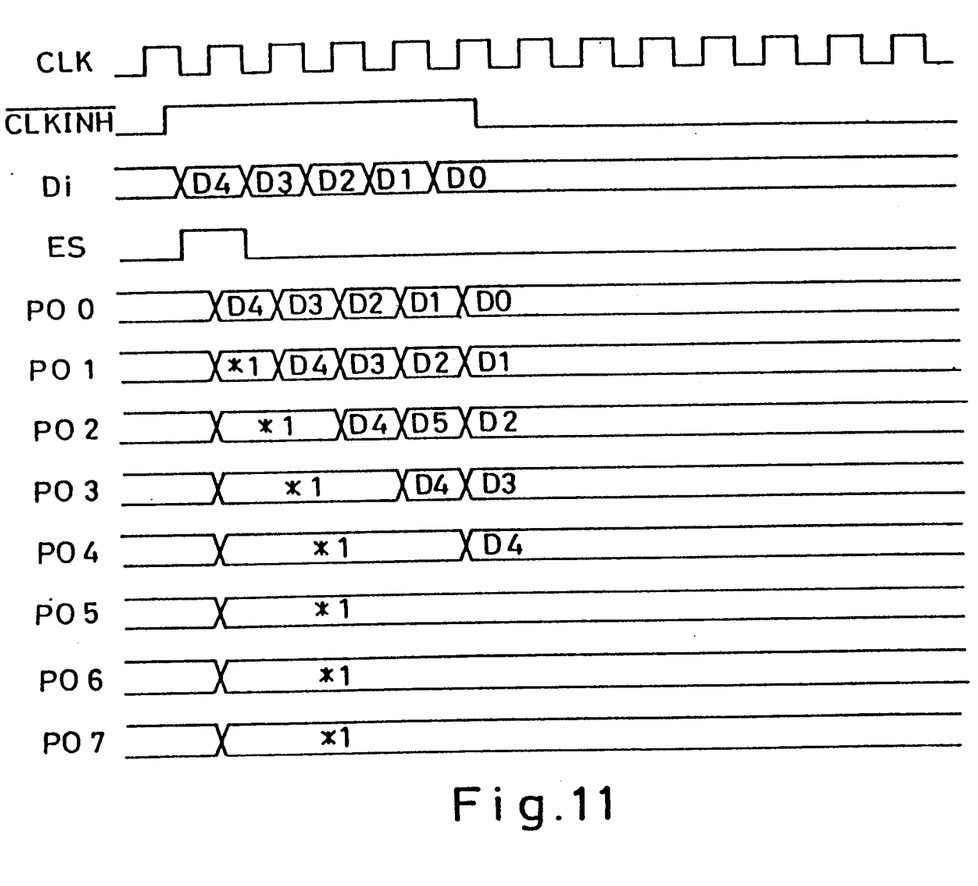
FIG. 11 is a timing chart in FIG. 9.

FIG. 11 is a timing chart of the circuit shown in FIG. 9 when the five bits serial data D4 to D0 are input based on FIG. 11. The operation of the arrangement of FIG. 9 is described below.

The principal operation is same as that of the circuit in FIG. 5. The difference is that the outputs of the output terminal PO1 to PO7 become as follows in case of the input of the sign extension data Dc as marks *1 in FIG. 11:

(A) In case of the input of the twos complement data, the MSB serial data D4 is output as it is, that is, *1=D4 is output;

(B) In case of the input of the offset binary data, the MSB serial data D4 is inverted by the inverter 45 as illustated in FIG. 10 and output, that is, *1=D4 is output;

(C) In case of the input of the straight binary data, "0" data, i.e., *1="0" is output by turning on the switch 43 as illustrated in FIG. 10.

In view of the above, for example, the following output is obtained:

(a) In case of the input of the twos complement data, if the input serial data D4 to D0 are positive numbers "0101", D4="0" is subjected to the sign extension so that the output terminals PO7 to PO0 become "00000101" upon completion of the input of the serial data. If the input serial data D4 to D0 are negative numbers, D4="1" is subjected to the sign extension so that the output terminals PO7 to PO0 becomes "11111010" upon completion of the input of the serial data;

(b) In case of the input of the offset binary data, if the input serial data D4 to D0 are positive numbers "1010", D4="0" is subjected to the sign extension so that the output terminals PO7 to PO0 become "00000101" upon completion of the input of the serial data. If the input serial data D4 to D0 are negative numbers, $\overline{D4}$="1" is subjected to the sign extension so that the output terminals PO7 to PO0 become "11111010" upon completion of the input of the serial data;

(c) In case of the input of the straight binary data, if the input serial data D4 to D0 are positive numbers "1010", "0" is subjected to the sign extension, the output terminals PO7 to PO0 become "00000101" upon completion of the input of the serial data.

The following effects can be obtained according to the present invention:

(1) In the n bits serial receiving circuit, in case of the input of the 1 to n offset binary data having an arbitrary bit length, the twos complement representation and 1 to (n−1) straight binary serial data having an arbitrary bit length, the parallel data having n bits twos complement representation can be obtained without loss of time upon completion of the reception of the serial data;

(2) It is possible to effect interface with a plurality of the serial data transmitting circuits 3 having different data format (straight binary digit and the like) in addition to the same effect as the effect (ii) obtained in the arrangement as illustrated in FIG. 5, The first and the second embodiments of the present invention are not limited to the embodiments set forth above and many variations are possible such as the arrangements, illustrated in FIGS. 6, 7 and 10, which are composed of other FFs, gate circuits and the like.

As explained above, in the serial data receiving circuit according to the present invention, it is possible to apply the present invention to the data processing apparatus for converting the serial data to the parallel data in the microcomputer, the voice processing apparatus and the measuring apparatus.

I claim:

1. A serial data receiving circuit comprising:
   a most significant bit input detecting circuit for providing a control signal in synchronism with an input of the most significant bit of a serial data;
   a selection circuit for selecting the serial data applied to a serial data input terminal when the control signal is active and providing a selected serial data, and selecting a shifted low order bit applied to a low order bit input terminal when the control signal is inactive;
   a plurality of unit circuits having parallel data output terminals for providing an output of the selection circuit as one of the parallel data; and
   a data converter circuit for subjecting the serial data to a sign extension when the control signal is active and shifting the serial data from a low order bit to a high order bit when the control signal is inactive.

2. A serial data receiving circuit according to claim 1, wherein the serial data is represented by twos complement.

3. A serial data receiving circuit according to claim 1, wherein the most significant bit input detecting circuit comprises:
   an input enable input terminal for receiving an input enable signal which is synchronous with input of the most significant bit of the serial data;
   a clock signal input terminal for receiving a clock signal;
   a differentiating circuit for differentiating the input enable signal upon reception of the input enable signal and the clock signal; and p1 a control signal output terminal for providing the output of the differentiating circuit as the control signal.

4. A serial data receiving circuit comprising:
   a most significant bit input detecting circuit for providing a given control signal in synchronism with input of a most significant bit of a serial data;
   a sign extension data processing circuit for selectively converting the serial data to a sign extension data on a basis of a format designating control signal;
   a selection circuit for selecting the serial data applied to the serial data input terminal when the control signal is active and providing the selected serial data, and selecting a shifted low order bit applied to a low order bit input terminal when the control signal is inactive;
   a plurality of unit circuits having parallel data output terminals for providing the output of the selection circuit as one of the parallel data; and
   a data converter circuit for subjecting the sign extension data to a sign extension when the control signal is active and shifting the serial data from a low order bit to a high order bit when the control signal is inactive.

5. A serial data receiving circuit according to claim 4, wherein the most significant bit input detecting circuit comprises:
   an input enable input terminal for receiving an input enable signal which is synchronous with input of the most significant bit of the serial data;
   a clock signal input terminal for receiving a clock signal;
   a differentiating circuit for differentiating the input enable signal upon reception of the input enable signal and the clock signal; and
   a control signal output terminal for providing the output of the differentiating circuit as the control signal.

6. A serial data receiving circuit according to claim 4, wherein the sign extension data processing circuit comprises:
   a serial data input terminal for receiving the serial data;
   a format designating control terminal for receiving the format designating control signal in response to a format of the serial data;
   a selection data output circuit for selecting the serial data, or the inverted serial data obtained by inverting the serial data, or the sign extension data of the serial data; and
   a selection data output terminal for providing the output of the selection data output circuit.

* * * * *